(12) United States Patent
Bremicker et al.

(10) Patent No.: US 12,028,998 B2
(45) Date of Patent: Jul. 2, 2024

(54) HOUSING FOR AN ELECTRICAL DEVICE HAVING A COVER AND ELECTRICAL DEVICE HAVING A HOUSING

(71) Applicant: SMA Solar Technology AG, Niestetal (DE)

(72) Inventors: Sven Bremicker, Alheim-Baumbach (DE); Martin Dziuba, Fuldatal (DE); Waissi Tello, Kassel (DE)

(73) Assignee: SMA Solar Technology AG, Niestetal (DE)

( * ) Notice: Subject to any disclaimer, the term of this patent is extended or adjusted under 35 U.S.C. 154(b) by 0 days.

(21) Appl. No.: 17/679,407

(22) Filed: Feb. 24, 2022

(65) Prior Publication Data
US 2022/0183175 A1 Jun. 9, 2022

Related U.S. Application Data

(63) Continuation of application No. PCT/EP2020/073358, filed on Aug. 20, 2020.

(30) Foreign Application Priority Data

Aug. 26, 2019 (DE) .................. 10 2019 122 812.3

(51) Int. Cl.
*H05K 5/03* (2006.01)
*H05K 5/00* (2006.01)
*H05K 5/02* (2006.01)

(52) U.S. Cl.
CPC ............. *H05K 5/03* (2013.01); *H05K 5/0008* (2013.01); *H05K 5/0208* (2013.01)

(58) Field of Classification Search
CPC ...... H05K 5/03; H05K 5/0008; H05K 5/0208; H05K 7/1432; H05K 5/061
See application file for complete search history.

(56) References Cited

U.S. PATENT DOCUMENTS 2,604,507 A * 7/1952 Tyson .................. H04B 15/025
174/374
4,313,025 A * 1/1982 Grube, Jr. ................ H05K 5/03
220/555
(Continued)

FOREIGN PATENT DOCUMENTS

DE 202014100486 U1 5/2015
DE 202015106657 U1 3/2017
(Continued)

OTHER PUBLICATIONS

Espacenet translation of JP 2011171525 (Year: 2011).*
International Search Report dated Nov. 2, 2020 for International Application No. PCT/EP2020/073358,.

*Primary Examiner* — Abhishek M Rathod
(74) *Attorney, Agent, or Firm* — Eschweiler & Potashnik, LLC

(57) ABSTRACT

The disclosure relates to a housing of an electrical device for converting electrical power, including a main body and a cover. The cover closes the main body to define a self-contained interior space, wherein electrical and electronic components of the electrical device are arranged in the interior space of the housing. The cover is connected to the main body via a detchable securing structure, which may be arranged in the geometrical center of the cover. An electrical device has a housing of this type.

18 Claims, 5 Drawing Sheets

(56) References Cited

U.S. PATENT DOCUMENTS

| | | | |
|---|---|---|---|
| 8,780,566 B2* | 7/2014 | Stengel | H05K 5/066 361/728 |
| 9,398,710 B2* | 7/2016 | Drew | H05K 7/1427 |
| 2010/0149757 A1* | 6/2010 | Stengel | H05K 5/066 361/728 |
| 2013/0143478 A1 | 6/2013 | Arcos et al. | |
| 2016/0249467 A1* | 8/2016 | Rajauria | H02B 13/025 |
| 2017/0181298 A1* | 6/2017 | Ahrens | H05K 5/03 |

FOREIGN PATENT DOCUMENTS

| | | |
|---|---|---|
| EP | 0435123 A1 | 7/1991 |
| JP | S6035584 U | 8/1983 |
| JP | H10322813 A | 12/1998 |
| JP | 2006108257 A | 4/2006 |
| JP | 2011035179 A | 2/2011 |
| JP | 2011171525 A | 9/2011 |

* cited by examiner

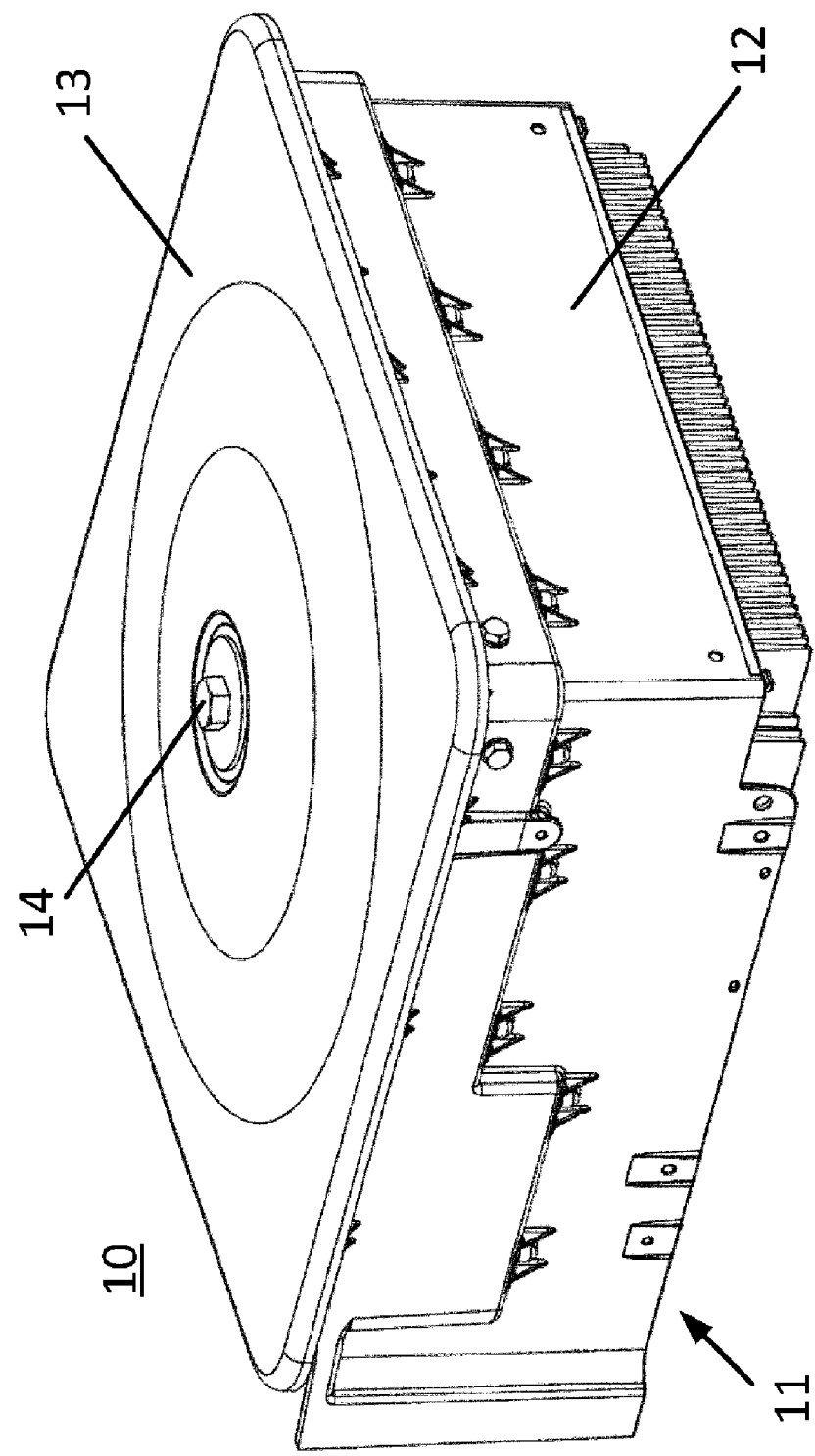

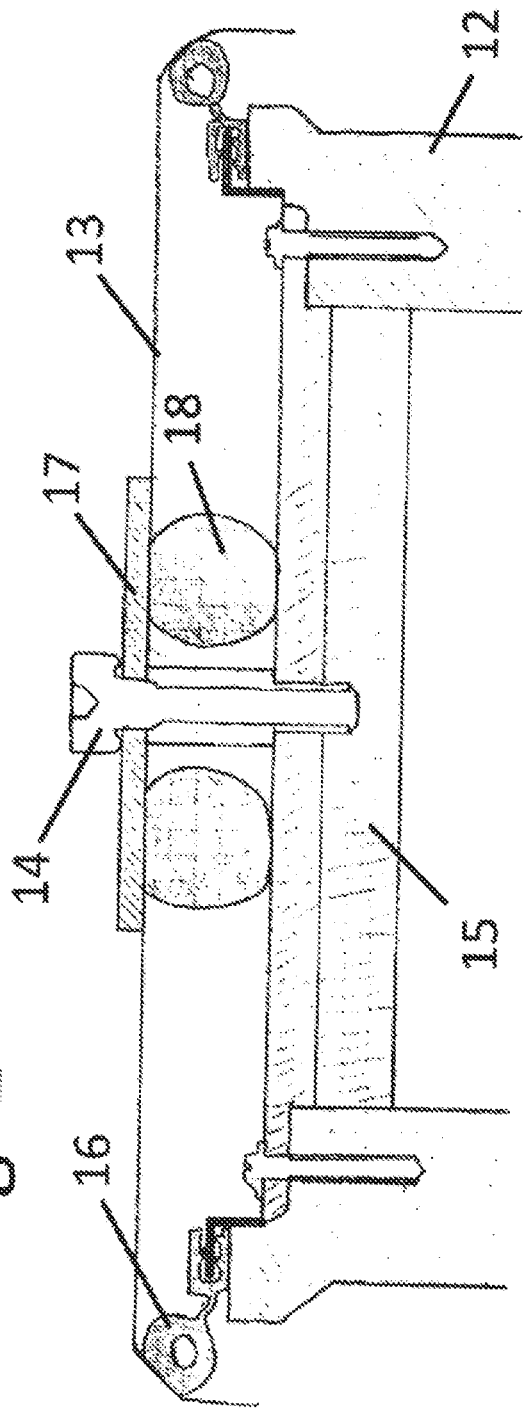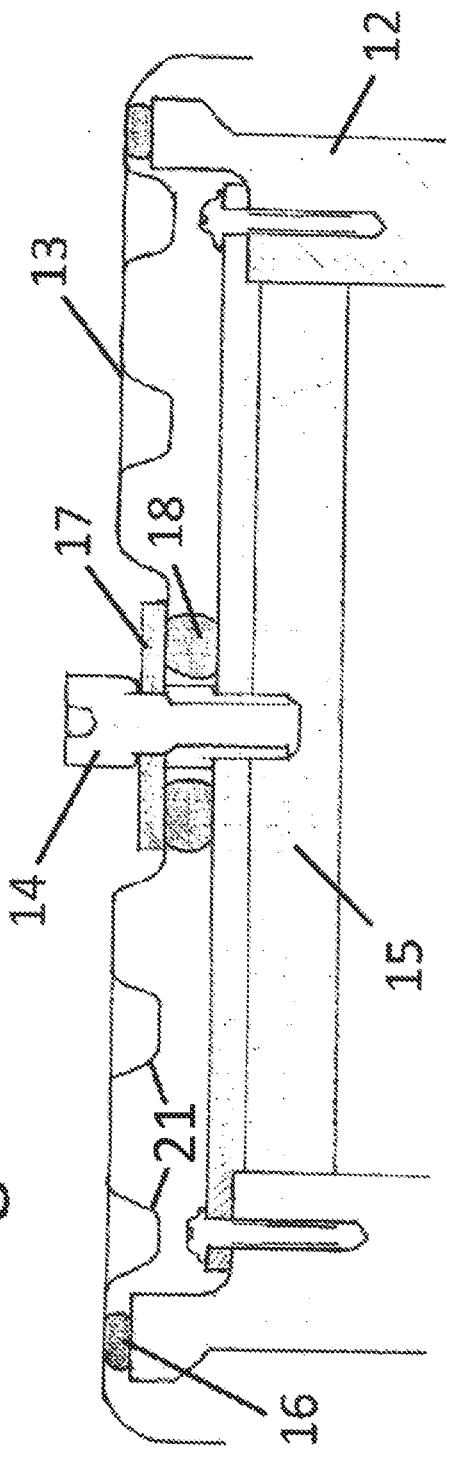

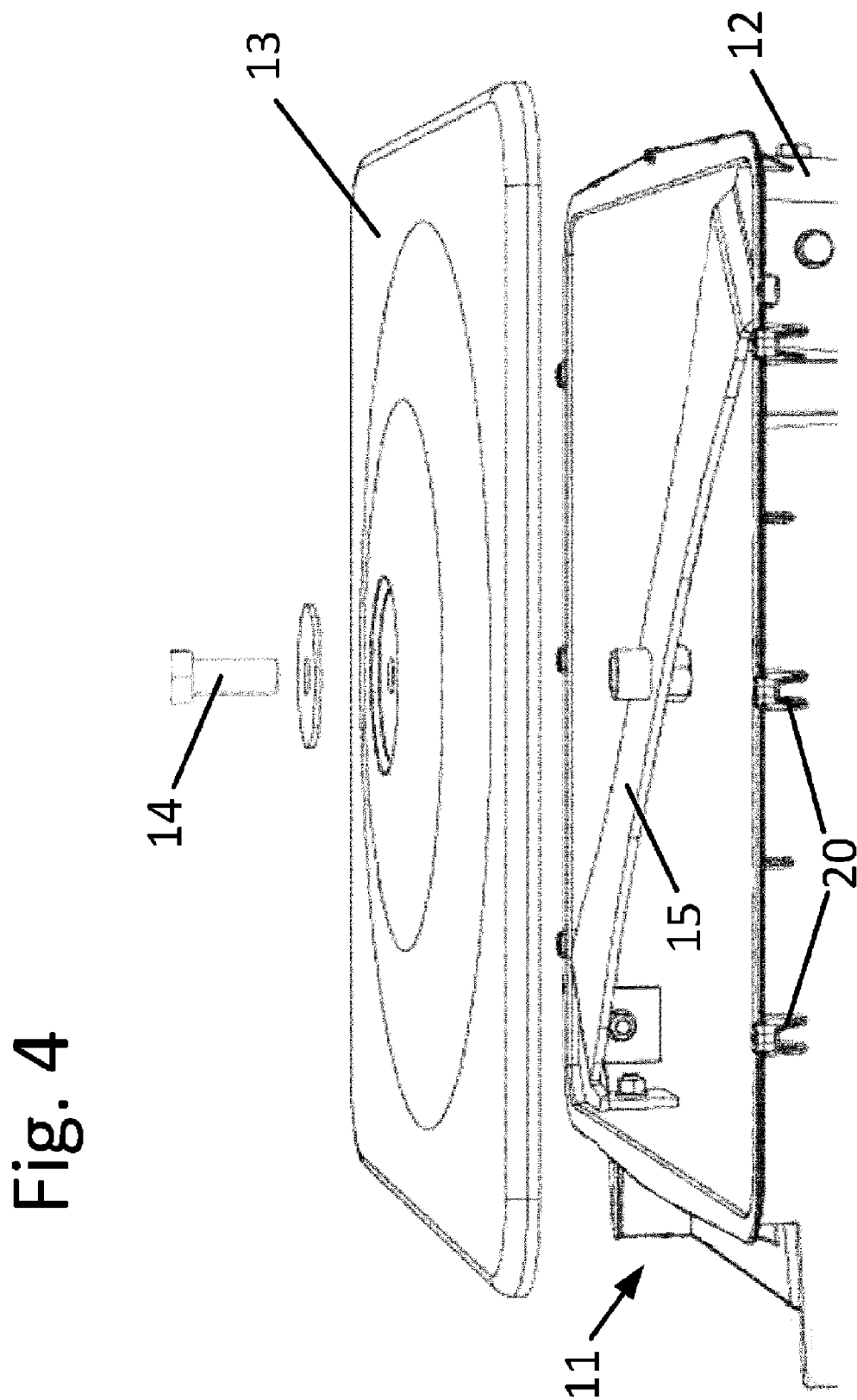

HOUSING FOR AN ELECTRICAL DEVICE HAVING A COVER AND ELECTRICAL DEVICE HAVING A HOUSING

REFERENCE TO RELATED APPLICATIONS

This Application is a Continuation of International Application number PCT/EP2020/073358, filed on Aug. 20, 2020, which claims the benefit of German Application number 10 2019 122 812.3, filed on Aug. 26, 2019. The contents of the above-referenced Patent Applications are hereby incorporated by reference in their entirety.

FIELD

The disclosure relates to a housing for an electrical device for converting electrical power, and to an electrical device having a corresponding housing.

BACKGROUND

An electrical device in the sense of this disclosure processes electrical power—in particular, by converting electrical currents from one form into another, e.g., from direct current into alternating current or vice versa, or by changing essential properties of the electrical power, e.g., the voltage or the frequency, in a targeted manner. In particular, the device can be an electronic power device, i.e., a power converter, in which circuit breakers are arranged in a converter topology and interact with capacitors and inductors.

During operation of an electrical device of this kind, the voltages and currents applied to the terminals of the power converter are influenced in a targeted manner by suitable clocking of the circuit breakers. In the process, considerable electrical power can flow through the electrical device and be exchanged between the apparatuses connected thereto. For example, an energy source—in particular, a power-supply network, a generator, or a battery—can be connected to an energy sink—in particular, to a load, a battery, or, in turn, a (further) power-supply network—by means of a power converter in a housing.

In the field of renewable energies, inverters for feeding into the network, e.g., photovoltaic inverters, are generally designed for powers from approximately one kilowatt and up. This also applies to battery converters which are connected to electrical storage devices and supply power to, for example, an island network. Even powers over ten kilowatts are routinely converted in an electrical device having a housing. For larger energy-generation systems, the rated powers of individual electronic power devices can be in the megawatt range, wherein voltages in the kilovolt range and currents in the kiloampere range occur. In principle, the rated power has no upper limit and depends substantially upon technical advances with respect to available circuit breakers, suitable topologies, achievable power density, materials, and the like. In principle, the volume of the corresponding housing increases with the rated power of an electrical device, such that other mechanical concepts—in particular, switchgear cabinets instead of housings—can be used at very high powers.

A housing of an electrical device of this kind must meet various regulatory requirements, depending upon the field of application. In particular, the housing can shield the interior space of the device from the surroundings and, for example, be closed in a dust-tight and watertight manner, such that the housing has an IP protection rating according to DIN EN 60529 and/or corresponds to one of the NEMA protection ratings according to NEMA standard 250-2003. In addition, a housing might have to pass further mechanical tests according to DIN and/or UL standards, e.g., with regard to compression, impact testing, external effects such as bird impact, and/or special water jetting.

When handling high electrical powers using an electrical device, extremely high energy concentrations can accumulate in the housing of the device in a very short time. This may be desirable, e.g., in order to use capacitors or inductors to temporarily store electrical energy in the context of the dynamic conversion from one form of current to another. However, undesirable energy concentrations can also occur—in particular, in the event of a fault, when incorrect operation occurs, or due to unpredictable aging processes. In this case, electrical energy can be converted to a considerable extent into thermal and/or mechanical energy, e.g., by components being heated excessively and breaking, or by flammable substances collecting in a housing, e.g., due to (electro)chemical conversion processes, and being ignited by electrical arcing, which is harmless in itself.

As a result, a considerable overpressure can build up in the housing, which is sealed per se, of the electrical device. In the case of an electronic power converter, which has, for example, one of the usual IP ratings, IP44 or IP65, the overpressure can also build up very quickly, e.g., within a few milliseconds, under unfavorable circumstances. This should, however, not lead to the housing being destroyed in an unpredictable manner, e.g., by breaking apart uncontrollably and, possibly, by parts being ejected from the interior space.

If the housing is not constructed with considerable material resources in such a way that it withstands any expectable overpressure, the overpressure in the interior space of the housing can be reduced by providing a relief opening. At the same time, however, in order to adhere to the relevant standards, it is necessary to design the housing such that it adequately protects the interior space during normal operation, provides mechanical stability against external effects, and is sealed—potentially, in a watertight or even airtight and dust-tight manner.

These two objectives—sufficient protection of the interior space, and thus of the electronic power components arranged therein, with respect to the surroundings during normal operation on the one hand, and controlled provision of a sufficiently large relief opening in the event of an overpressure on the other—are at first glance functionally contrary to one another and considerably restrict the available scope for solutions.

Various solutions are known from the prior art and are intended to ensure that the pressure of an overpressure, which may in some cases occur suddenly, is reduced in a more or less controlled manner and as safely as possible in a housing that is sealed per se.

DE 20 2014 100 486 U1 discloses a housing for an inverter, having a cover, in which the cover is mounted on the housing by means of a deformable securing element, wherein the securing element is deformed in the event of a sudden overpressure in the housing and opens a gap between the cover and the housing, through which gap the overpressure can be reduced.

DE 20 2015 106 657 U1 discloses a housing for accepting electronic components, in which a cover is connected to a housing body at several securing points, wherein cutouts are provided in the region of at least one of the securing points and enable deformation of the housing in the event of an overpressure in the interior space, such that the overpressure can be reduced through a gap produced between the housing body and the cover.

US 2016 249 467 A1 discloses a pressure-reduction mechanism for a housing of an electrical device, in which a pressure-reduction opening in the housing is closed by an external cover, which is pulled inwards by a spring so that said cover is pushed outwards by an overpressure and opens the opening.

EP 0 435 123 A1 discloses a housing which has a pressure-relief wall consisting of two pressure-relief flaps which are arranged in mirror symmetry and abut one another centrally, wherein the pressure-relief flaps, on the one hand, are rigidly connected to the housing walls by means of securing flanges and, on the other, are, in the event of an overpressure, able to swing open as a result of a targeted weakening of the securing flanges. It should be noted that bulging of the surfaces of the pressure-relief flaps is to be avoided, since this would hinder the swinging-open of the pressure-relief flaps. However, if the swinging-open does take place, parts from the interior space can enter the surroundings in an unhindered manner.

US 2013 143 478 A1 discloses a housing for an electrical device, in which a pressure-relief opening is provided, which consists of four triangular flaps, the sides of which come together and the bases of which form a square, wherein the flaps each are connected to the housing only at their base and have targeted weak points along their base, such that all flaps are bent open outwards in the event of an overpressure in the housing and open a pressure-relief opening.

None of the known solutions provide a sufficiently large opening for reducing pressure quickly enough in the event of a sudden overpressure in the interior space of the housing while at the same time meeting the requirements mentioned at the outset for the mechanical properties of a housing, which, in particular, are to be suitable for an electrical device for converting considerable electrical powers.

SUMMARY

The disclosure is directed to a housing for an electrical device that withstands the usual environmental and use conditions of a device of this kind, while at the same time being able to provide a large pressure-relief area in a short enough time that a sudden overpressure can be reduced in a controlled manner, wherein the parts arranged in the interior space of the housing are retained in the process, thereby increasing safety.

A housing of an electrical device for converting electrical power has a main body and a cover. The cover closes the main body, such that a self-contained interior space is formed or otherwise defined. Electrical and electronic components of the electrical device are arranged in the interior space of the housing. The cover is connected to the main body by means of a detachable securing structure. In one embodiment, the housing has the securing structure arranged in the geometric center of the cover.

One aim of the disclosure is thus achieved in that the electrical device has a closed housing as a protective apparatus, wherein the detachably-secured cover of the housing is designed as a surroundings protector having an integrated overpressure protection system. In the event of a sudden overpressure, the entire surface, or at least a portion of the surface, around the central securing structure serves as an engagement surface for pressure peaks and pulses. The cover is prevented from deforming only by its stiffness. As a result, the cover acts as an overpressure protection system and enables sufficient pressure reduction.

At the same time, the cover is held on the main body by the central securing structure. The securing structure is arranged, in one embodiment, in the center of the cover so as to be, on average, at the same distance from all edges of the cover. In this context, it goes without saying that certain deviations from a geometrically-exact center point are possible—for example, for structural or purely optical reasons. The area of the cover exposed to the internal pressure thus substantially corresponds to a circular ring in the case of a round cover, or to a "square circular ring" in the case of a square cover. This circular ring continues to retain any parts that have detached inside the electrical device or deflects them, at least laterally, provided it has deformed and thus (partially) opened. In this respect, the cover protects the surroundings of the electrical device against a pressure wave and minimizes the danger to people.

The cover is secured to the main body, in one embodiment, solely by the centrally-arranged securing structure and is not connected to the main body by any further securing mechanism. In this context, it goes without saying that comparatively weak connections between the cover and the housing, e.g., adhesion forces of seals, slight canting, or guide hooks, are not to be understood as a securing structure.

In one embodiment of the housing, the main body has a rear wall and side walls, and the cover has a sealing surface extending generally in one plane. The cover, then, rests with the sealing surface on rims of the side walls of the cover. It goes without saying that the side walls may be formed by a single component in one embodiment; in this respect, housings having a round rear wall and a correspondingly continuous side wall are also included.

In one embodiment, a circumferential seal can be arranged between the rims of the side walls of the main body and the cover. A pressure force is exerted on the seal by the securing structure via the cover. This pressure force is dependent upon the stiffness of the cover and can be adjusted such that the housing can be closed tightly. As a result, a protection rating of the interior space of the housing of at least IP45—preferably of at least IP65—and/or of NEMA Type 4X can be ensured.

In one embodiment, the entire cover assembly having the centrally-attached securing structure and circumferential seal is designed such that the electrical device can be operated continuously and reliably under all weather conditions and at all electrical parameters. For this purpose, the cover stiffness, in particular, is dimensioned such that the cover is, for one thing, rigid enough to transmit a contact pressure from the central securing structure by means of the cover surface to the edge, and thus to the seal, in such a way that the seal is exposed to the necessary compression force. At the same time, the cover has a stiffness that is optimized in such a way that said cover can deform circumferentially in relation to the centrally-attached securing structure when a specific internal pressure is reached. As a result, an optimized opening area for pressure relief can be generated, and the pressure escapes slowly. In addition, in the event of an explosion, the loading of the securing structure and of a holding apparatus comprising said securing structure is reduced overall, since the cover deforms and reduces the effective engagement surface area for the internal pressure, such that the cover does not tear out at the securing structure.

In one embodiment, the holding apparatus can comprise a crossmember, which is secured to opposing points of the side walls of the main body. This crossmember serves as a counterpart to the externally-arranged and detachable securing structure, such that a detachable connection can be established between the cover and the crossmember by means of the securing structure.

The housing can have four side walls, which are arranged to be generally perpendicular to a rear wall of the housing. The crossmember can then, advantageously, be arranged diagonally between two opposing corners of the side walls. The housing is particularly stiff at the corners of the side walls, such that the connection of the crossmember via the corners of the housing increases the ultimate load of the holding apparatus. In addition, by arranging the crossmember diagonally, two corners of the housing are freely accessible, wherein one of these housing corners can comprise, in particular, a connection region of the electrical device. This connection region is, then, largely freely accessible when the cover is open, so that the crossmember can remain in the device during commissioning of the device, and no additional assembly work is required.

Alternatively or in addition to the crossmember, in one embodiment, the main body further comprises a dome which extends from the rear wall of the housing to the geometric center of the cover. On the side facing the cover, this dome can have a counterpart to the securing structure such that a detachable connection can be established between the cover and the dome by means of the securing structure. A dome arranged centrally in this way and secured to the rear side of the main body provides optimal accessibility of the interior space of the housing when the cover is open according to one embodiment.

In one embodiment, the securing structure can, in particular, be designed to be screwable and can comprise a screw or a nut. The screw head or the nut is arranged on the outside of the cover. A mating thread for the screw or an outward-facing threaded rod for the nut can be arranged on the crossmember or on the dome. In one embodiment, the dome itself can comprise a rod or a tube which extends from the rear wall through the interior space and through the cover, such that the securing means can be screwed directly onto the rod or into the tube.

In a further embodiment, a stiffening plate can be arranged between the screw head or the nut and the cover, and is connected to the cover in a frictionally-connected and/or integrally-bonded manner. In one embodiment, the diameter of the stiffening plate is between twice the diameter of the screw head or the nut and half the diameter of the cover. As a result, a force acting on the cover from the inside as a result of an overpressure is prevented from acting solely on the securing structure itself, and the cover is prevented from tearing out around the securing means.

The housing according to the disclosure can, in one embodiment, accommodate electronic power components in the interior space. These include, for example, switches, capacitors, and/or inductors, which are provided for converting the electrical power within the device.

In the event that an overpressure occurs in the interior space of the housing, for example, in the event of a sudden overpressure, as can occur in a high-power electrical device, the cover can lift off from the rims of the side walls on some or all sides, for example, along the circumferential seal, and deform plastically. As a result, a pressure reduction towards all sides is possible. The plastic deformation also leads to a relief of the stress on the securing structure and on the holding apparatus corresponding thereto, since the surface area over which the overpressure acts decreases due to the deformation of the cover. This also reduces the tensile force on the securing structure.

In one embodiment, the cover comprises a ductile material that can deform plastically under load. For example, aluminum-magnesium alloys, e.g., $AlMg_3$, or deep-drawn sheet steel have a suitable ratio of tensile strength to yield strength. The pressure-wave energy released during an explosion is absorbed by a plastic deformation of the cover. In one embodiment, the material has an elongation at break of >6%, for example, in order to prevent the cover tearing out at the securing structure.

In a further embodiment, the edge of the cover has a circumferential chamfer, such that the edge of the cover is oriented generally in parallel with the side walls of the main body. As a result, the cover can be mounted on the main body with an exact fit in a particularly simple manner, and any seal is laterally protected and/or supported by the chamfer, i.e., is prevented from transverse contraction if necessary.

In one embodiment, the electrical device comprises a power converter, for example, a rectifier, an inverter, and/or a DC/DC converter. The power converter can have an electrical rated power of at least one kilowatt, for example, of at least ten kilowatts. Especially in the field of power converters having rated powers in the range of several tens to several hundreds of kilowatts, technical advances are accompanied by power density increases, which at the same time exacerbate the problem mentioned at the outset of undesirable energy accumulations, thus necessitating housings that are adapted to the accordingly increasing risk.

An electrical device according to the disclosure has a housing having the described properties and comprises a first terminal and a second terminal for exchanging electrical power with separate apparatuses. In this case, the first terminal can be configured for connection to a first energy source or a first energy sink, for example, to a generator or a battery, and the second terminal can be configured for connection to a second energy source or a second energy sink—in particular, to a power-supply network.

In one embodiment, the device is a photovoltaic inverter or a bidirectional battery inverter for connection to an AC voltage network.

In a further embodiment, the device is a DC/DC converter for connecting a photovoltaic generator or a battery to an inverter or to a load, wherein the load can include a DC voltage network.

A power-supply network and/or a battery are particularly potent suppliers of energy that enable particularly high energy accumulations, such that the housing of the device must be designed accordingly. This applies, for example, to electrical devices having a rated power of at least one kilowatt, and all the more to electrical devices having a rated power of at least ten kilowatts.

BRIEF DESCRIPTION OF THE DRAWINGS

The disclosure will be explained and described further below with reference to example embodiments illustrated in the figures.

FIG. 1 shows a first embodiment of an apparatus according to the disclosure;

FIG. 2 shows a sectional view of a further embodiment of the apparatus according to the disclosure;

FIG. 3 shows a sectional view of a further embodiment of the apparatus according to the disclosure;

FIG. 4 shows a further embodiment of the apparatus according to the disclosure;

DETAILED DESCRIPTION

Figure 5:
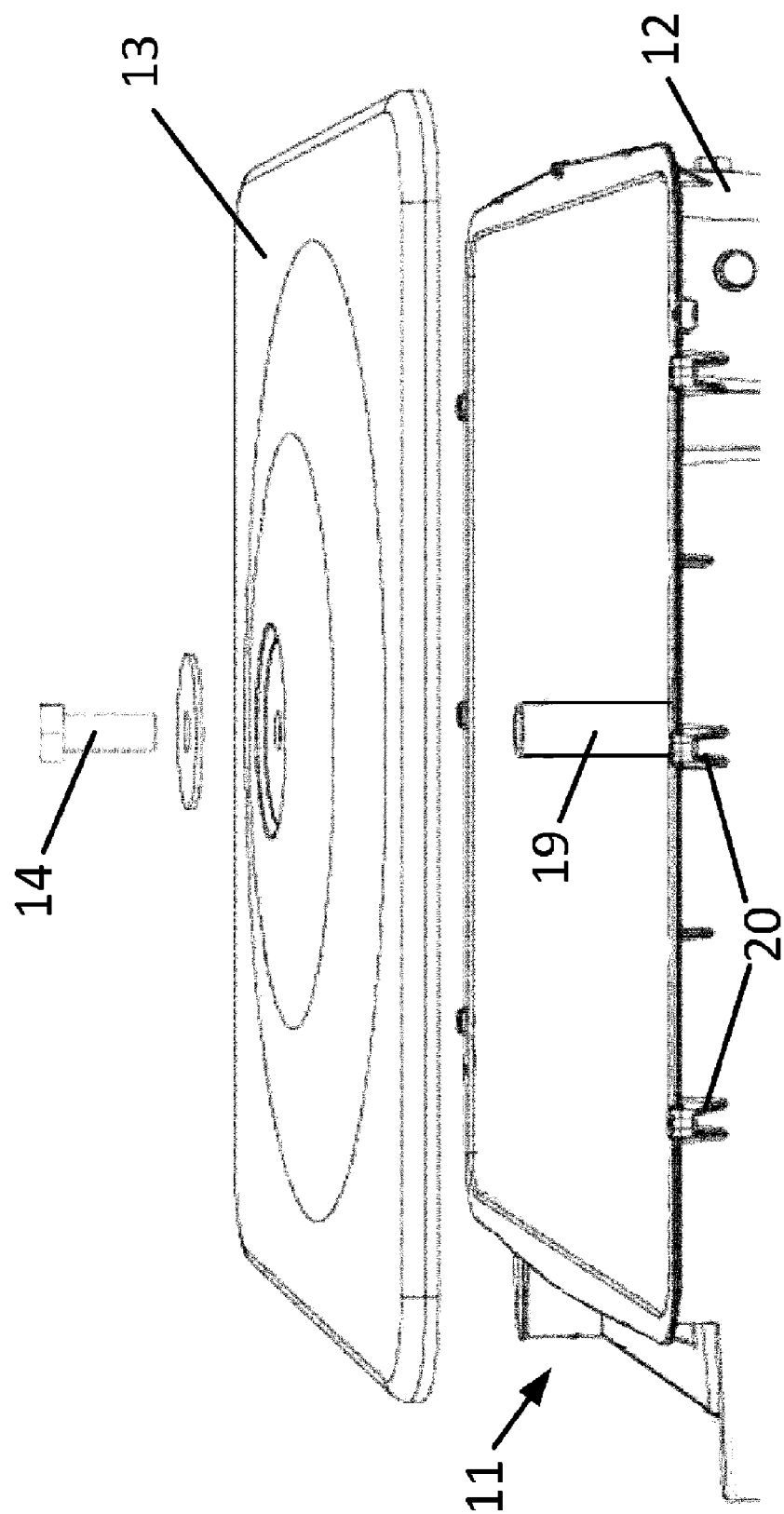
FIG. 5 shows a further embodiment of the apparatus according to the disclosure.

FIG. 1 shows an electrical device 10 having a housing 11. The housing 11 comprises a main body 12. The main body 12 can be formed in one piece, e.g., as a die-cast molded part, or be comprised of several parts,—for example, of a rear wall and side walls. In one embodiment, the main body can have a generally rectangular outline according to FIG. 1, such that it comprises four, generally planar, side walls, or can have a round or oval outline (not shown), such that it generally has one circumferential side wall.

The housing 11 comprises a cover 13. The main body 12 and the cover 13 together form, or otherwise define, a self-contained interior space of the housing 11 in that the cover 13 is placed on the rims of the side walls of the main body 12 in a frictionally-connected manner. In one embodiment, any openings in the side walls and/or the rear wall of the main body 12, e.g., for cable bushings, can themselves be designed to have suitable seals.

The cover 13 is detachably connected to the main body 12 by means of a central securing structure 14. According to one embodiment illustrated in FIG. 1, the securing structure 14 can be configured as a screw, the screw head of which is arranged on the outside of the cover 13 and which is screwed into a thread arranged in the interior space of the housing 11. Alternatively, further embodiments of the detachable securing structure 14 are conceivable, e.g., as a nut on a threaded rod protruding from the outside of the cover 13, as a locking plug-in connection, or the like. However, in one embodiment the securing structure 14 is the only securing mechanism by which a defined, permanently stable, and detachable connection between the main body 12 and the cover 13 is produced.

FIG. 2 shows a cross-section through a housing 11 together with parts of the main body 12—in particular, the edge regions of the side walls—and a cover 13 according to one embodiment. A crossmember 15 is arranged between the side walls of the main body 12. The securing structure 14 establishes a detachable connection between the cover 13 and the crossmember 15, and thus to the main body 12. According to FIG. 2, the crossmember 15 can rest on a rim of the side wall of the main body 12 and be secured there, or can be connected to the side walls of the main body 12 in another form or manner—possibly, also detachably (cf. FIG. 4).

The force exerted by the securing structure 14 on the cover 13 is transmitted to the edges of the cover 13 via the surface of the cover 13. As a result, a seal 16 arranged between the cover 13 and the edges of the side walls of the main body 12 can be compressed and seal off the transition between the main body 12 and the cover 13. The resulting force acting on the seal 16 can, depending upon the design and field of application of the device 10, be selected such that the tightness of the housing 11 required in each case is achieved. In one embodiment, the resulting force on the seal 16 depends, among other things, upon the specific material properties of the cover—in particular, its stiffness—and upon structural limitations of the securing structure, e.g., a thread length of the screw or of a comparable threaded rod. In the process, the material properties of the cover 13—in particular, its stiffness—are to be designed such that the necessary compression force on the seal 16 is achieved.

According to FIG. 2, in one embodiment the seal 16 can be configured as a hollow chamber seal, which already achieves a good sealing action between the main body 12 and the cover 13 at small resulting forces. As a result, the housing 11 can have an overall protection rating of IP45 or higher.

In one embodiment, a stiffening plate 17, e.g., a washer, which can have a round or angular shape, can be arranged between the outer engagement point of the securing structure 14, i.e., the screw head according to FIG. 1, and the cover 13. Further spacers 18 can be arranged between the cover 13 and the crossmember 15, e.g., sealing rings or solid, screw-on blocks, which can specify a defined distance between the cover 13 and the crossmember 15 in the region of the stiffening plate 17. As an alternative to the crossmember 15, a dome 19 can be used (cf. FIG. 5).

In one embodiment, the cover 13 according to FIG. 2 has a generally planar shape having a circumferential chamfer and can be composed of a simple metal sheet that has been suitably shaped—in particular, by means of a deep-drawing process.

FIG. 3 shows a cross-section through a further housing 11 according to another embodiment of the disclosure. Unlike the embodiment according to FIG. 2, the seal 16 in this case is made of solid material or of a foamed plastic. A seal of this kind may be easier to process and, overall, may be more compact than a hollow chamber seal according to the embodiment of FIG. 2. In addition, in one embodiment, stiffening struts 21 are arranged on the cover 13 according to FIG. 3; these increase the stiffness of the cover 13 and therefore ensure better transmission of the force, exerted by the securing structure 14 on the cover 13, to the edges of the cover 13 via the surface of the cover 13, and thus of the force exerted on the seal 16.

FIG. 4 is an illustration of a housing 11 according to another embodiment of the disclosure, having a main body 12 and an open cover 13. The cover 13 can be detachably connected to the crossmember 15 via a securing structure 14. A force exerted by the securing structure 14 on the cover 13 is transmitted, via the surface of the cover 13, to the edges of the cover 13, where it compresses a seal arranged between the cover and the edges of the side walls of the main body 12 (not shown). In this case, the cover 13 has a slightly convex shape, i.e., it bulges outwards when viewed from the interior space of the housing 11. This achieves better transmission of the force from the securing structure 14 to the seal.

According to FIG. 4, in one embodiment the crossmember 15 can be arranged diagonally between the upper corners of the main body 12 and can be connected to the side walls of the main body 12. Alternatively, in one embodiment the crossmember 15 can be spanned between any opposite points of the side walls, i.e., points whose connecting straight line extends through the geometric center of the opening of the main body 12, such that the securing structure 14 is arranged in the geometric center of the cover 13.

In one embodiment the crossmember 15 can be detachably connected to the side walls of the main body 12 or be rigidly attached thereto. The main body 12 can comprise further edge elements 20, e.g., guide aids for correctly positioning the cover 13 on the main body 12 or contact pins for producing equipotential bonding between the main body 12 and the cover 13. Here too, however, besides the securing structure 14, there are no further defined, permanently stable, and detachable connections provided between the main body 12 and the cover 13 in this embodiment.

FIG. 5 is a further illustration of a housing 11 according to another embodiment of the disclosure, having a main body 12 and an open cover 13. The main body has a centrally-arranged dome 19, which can be secured to the rear side of the main body 11 and extends to below, or even through, the geometric center of the cover 14. In one embodiment, the cover 13 can be detachably connected to the dome 19 via the securing structure 14. Specifically, the dome 19 can have a mating thread into which the securing structure 14 (in this case, for example, a screw) is screwed. Alternatively, the dome 19 can project beyond the cover 19 so that a securing structure 14 (in this case, for example, a nut) can be screwed onto the dome 19.

Figure 6:
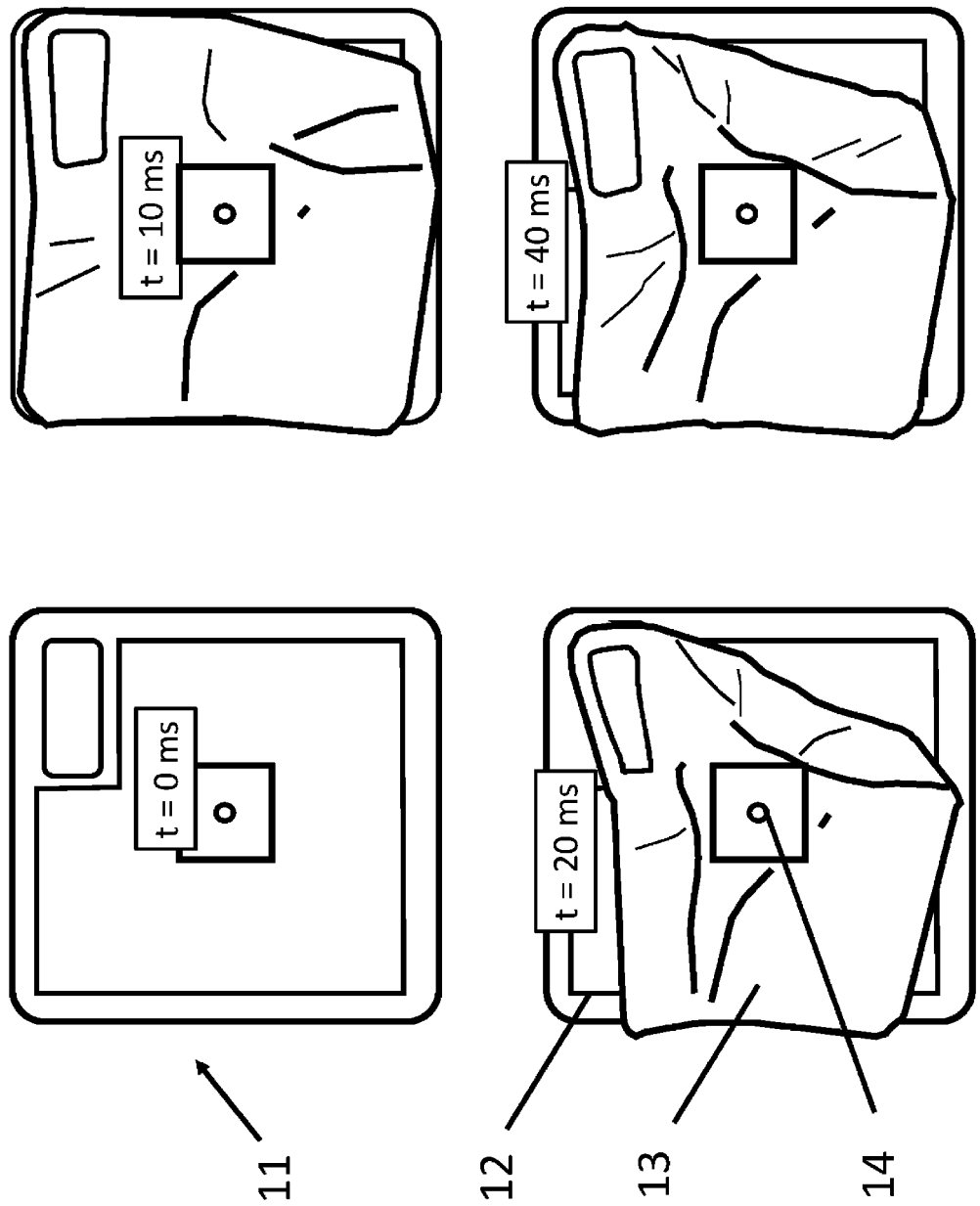
FIG. 6 shows the dynamic behavior of an apparatus according to the disclosure.

FIG. 6 shows a simulation of the plastic deformation of the cover 13 in the event of an explosion-like overpressure in the interior space of the electrical device 10. At time t=0 ms, the explosion-like pressure builds up (top left). At this time, the cover 13 rests on the rims of the side edges of the main body 11 and protects the interior space of the housing 11 from environmental influences. At time t=10 ms (top right), the cover 13 is deformed due to an overpressure inside and lifts off from the rims of the side edges 12 on all sides. This deformation continues slightly up to time t=20 ms and then comes to a stop once the overpressure in the interior space has been reduced. The cover 13 is then, at time t=40 ms, located in an end position (bottom right).

The invention claimed is:

1. A housing of an electrical device for converting electrical power, comprising:
a main body; and
a cover,
wherein the cover is configured to close the main body to define a self-contained interior space of the housing,
wherein components of the electrical device are arranged in the interior space of the housing,
wherein the cover is connected to the main body via a detachable securing structure that is arranged in a geometric center of the cover,
wherein the cover comprises a ductile metallic material that can deform plastically and absorb energy by way of deformation under load,
wherein the main body comprises a rear wall and side walls, and the cover comprises a sealing surface that extends in one plane and by which the cover rests on rims of the side walls of the main body, and
wherein the cover is configured so that, in the event of an overpressure occurring in the interior space of the housing, the cover lifts off from the rims of the side walls on one or more sides and deforms so that a pressure reduction towards the one or more sides occurs.

2. The housing according to claim 1, wherein, between at least a portion of the rims of the side walls of the main body and the cover, a circumferential seal is arranged on which the securing structure exerts a pressure force via the cover so that the housing is closed to ensure a protection rating of the interior space of the housing of at least IP44 or of NEMA Type 4X.

3. The housing according to claim 1, wherein the main body comprises a crossmember which is secured to opposing points of the side walls of the main body, wherein a detachable connection between the cover and the crossmember is produced via the securing structure.

4. The housing according to claim 3, wherein the main body comprises has four side walls which are arranged to be parallel to one another and arranged together to form four corners, wherein the crossmember is arranged diagonally between two opposing corners of the side walls.

5. The housing according to claim 4, wherein the securing structure is screwable and comprises a screw or a nut, wherein a head of the screw or the nut is arranged on an outside of the cover, wherein the crossmember has a mating thread for the screw or an outward-facing threaded rod for the nut, respectively.

6. The housing according to claim 1, wherein the main body comprises a dome, which extends from the rear wall of the housing to the geometric center of the cover, wherein a detachable connection between the cover and the dome is produced via the securing structure.

7. The housing according to claim 6, wherein the securing structure is screwable and comprises a screw or a nut, wherein the screw head or the nut is arranged on an outside of the cover, wherein the dome has a mating thread for the screw or an outward-facing threaded rod for the nut, respectively.

8. The housing according to claim 7, further comprising a stiffening plate arranged between the screw head or the nut and the cover in a frictionally-connected or integrally-bonded manner, wherein a diameter of the stiffening plate is between twice a diameter of a head of the screw or the nut and half a diameter or a width of the cover.

9. The housing according to claim 1, wherein the components in the interior space of the housing include switches, capacitors, or inductors that are configured to convert electrical power within the electrical device.

10. The housing according to claim 1, wherein the cover comprises an aluminum-magnesium alloy or a deep-drawn sheet steel so that the cover absorbs energy by way of deformation.

11. The housing according to claim 1, wherein an edge of the cover comprises a circumferential chamfer, wherein the edge of the cover is oriented in parallel with the side walls of the main body.

12. The housing according to claim 1, wherein the electrical device comprises a rectifier, an inverter, or a DC/DC converter and has an electrical rated power of at least one kilowatt.

13. The housing according to claim 1, wherein the ductile metallic material exhibits an elongation at break of >6%.

14. An electrical device having a housing, the housing comprising:
a main body; and
a cover, wherein the cover is configured to close the main body to define a self-contained interior space of the housing,
wherein one or more components of the electrical device are arranged in the interior space of the housing,
wherein the cover is connected to the main body via a detachable securing structure that is arranged in a geometric center of the cover, and wherein the cover comprises a ductile metallic material that can deform plastically and absorb energy by way of deformation under load,
wherein the main body comprises a rear wall and side walls, and the cover comprises a sealing surface that extends in one plane and by which the cover rests on rims of the side walls of the main body,
wherein the cover is configured so that, in the event of an overpressure occurring in the interior space of the housing, the cover lifts off from the rims of the side walls on one or more sides and deforms so that a pressure reduction towards the one or more sides occurs, and
wherein the electrical device comprises a first terminal and a second terminal, wherein the first terminal is configured to connect at least one of the one or more components of the electrical device to a first energy source or a first energy sink, and the second terminal is configured to connect at least one of the one or more components of the electrical device to a second energy source or a second energy sink.

15. The electrical device according to claim 14, wherein the electrical device is a photovoltaic inverter or a bidirectional battery inverter configured to connect to an AC voltage network.

16. The electrical device according to claim 14, wherein the electrical device is a DC/DC converter configured to connect a photovoltaic generator or a battery to an inverter or to a load, wherein the load includes a DC voltage network.

17. The electrical device according to claim 14, wherein the cover comprises an aluminum-magnesium alloy or a deep-drawn sheet steel so that the cover absorbs energy by way of deformation.

18. The electrical device according to claim 14, wherein the ductile metallic material exhibits an elongation at break of >6%.

* * * * *